United States Patent
Loccufier et al.

(10) Patent No.: US 10,591,821 B2
(45) Date of Patent: Mar. 17, 2020

(54) FLEXOGRAPHIC PRINTING PRECURSOR AND MAGNETIC DEVELOPMENT OF THE SAME

(71) Applicant: AGFA NV, Mortsel (BE)

(72) Inventors: Johan Loccufier, Mortsel (BE); Thomas Billiet, Mortsel (BE)

(73) Assignee: AGFA NV, Mortsel (BE)

( * ) Notice: Subject to any disclaimer, the term of this patent is extended or adjusted under 35 U.S.C. 154(b) by 31 days.

(21) Appl. No.: 15/579,619

(22) PCT Filed: Jun. 9, 2016

(86) PCT No.: PCT/EP2016/063101
§ 371 (c)(1),
(2) Date: Dec. 5, 2017

(87) PCT Pub. No.: WO2016/202669
PCT Pub. Date: Dec. 22, 2016

(65) Prior Publication Data
US 2018/0149979 A1    May 31, 2018

(30) Foreign Application Priority Data
Jun. 17, 2015 (EP) .................. 15172472

(51) Int. Cl.
| | |
|---|---|
| G03F 7/20 | (2006.01) |
| G03F 7/36 | (2006.01) |
| G03F 7/004 | (2006.01) |
| G03F 7/34 | (2006.01) |
| B41M 1/04 | (2006.01) |
| G03F 7/033 | (2006.01) |

(52) U.S. Cl.
CPC .............. *G03F 7/36* (2013.01); *B41M 1/04* (2013.01); *G03F 7/0047* (2013.01); *G03F 7/033* (2013.01); *G03F 7/20* (2013.01); *G03F 7/2002* (2013.01); *G03F 7/34* (2013.01)

(58) Field of Classification Search
CPC ........................................................ G03F 7/00
See application file for complete search history.

(56) References Cited

U.S. PATENT DOCUMENTS

| | | |
|---|---|---|
| 3,264,103 A | 8/1966 | Cohen et al. |
| 4,323,637 A | 4/1982 | Chen et al. |
| | (Continued) | |

FOREIGN PATENT DOCUMENTS

| | | |
|---|---|---|
| EP | 1 097 811 A1 | 5/2001 |
| EP | 1 239 329 A2 | 9/2002 |
| | (Continued) | |

OTHER PUBLICATIONS

Official Communication issued in International Patent Application No. PCT/EP2016/063101, dated Aug. 31, 2016.

*Primary Examiner* — Chanceity N Robinson
(74) *Attorney, Agent, or Firm* — Keating and Bennett, LLP

(57) ABSTRACT

A flexographic printing precursor includes a support and a photopolymerisable layer including a monomer, an initiator and having a thickness between 0.5 mm and 7.0 mm, characterized in that the photopolymerisable layer contains magnetic or magnetisable particles. A method of developing the flexographic printing precursor to obtain a printing element with a relief image using a magnetic field is provided.

6 Claims, 2 Drawing Sheets

(56) References Cited

U.S. PATENT DOCUMENTS

| | | | |
|---|---|---|---|
| 4,427,759 A | 1/1984 | Gruetzmacher et al. | |
| 5,175,072 A | 12/1992 | Martens | |
| 5,279,697 A | 1/1994 | Peterson et al. | |
| 6,308,628 B1 | 10/2001 | Bronstein et al. | |
| 6,773,859 B2 | 8/2004 | Fan et al. | |
| 7,122,295 B2 | 10/2006 | Mengel et al. | |
| 2004/0191572 A1 | 9/2004 | Gao et al. | |
| 2011/0089609 A1* | 4/2011 | Landry-Coltrain | B41C 1/05 264/400 |
| 2013/0255513 A1* | 10/2013 | Blomquist | G03F 7/12 101/395 |

FOREIGN PATENT DOCUMENTS

| | | |
|---|---|---|
| JP | 2010-150441 A | 7/2010 |
| WO | 01/18604 A2 | 3/2001 |
| WO | 01/88615 A1 | 11/2001 |

\* cited by examiner

FLEXOGRAPHIC PRINTING PRECURSOR AND MAGNETIC DEVELOPMENT OF THE SAME

CROSS REFERENCE TO RELATED APPLICATIONS

This application is a 371 National Stage Application of PCT/EP2016/063101, filed Jun. 9, 2016. This application claims the benefit of European Application No. 15172472.1, filed Jun. 17, 2015, which is incorporated by reference herein in its entirety.

BACKGROUND OF THE INVENTION

1. Field of the Invention

The present invention relates to flexographic printing precursors and more particularly to a method of development to produce a relief image printing element. This invention also relates to a process for making a flexographic printing element.

2. Description of the Related Art

Flexographic printing elements such as plates or sleeves are well known for use in printing surfaces which range from soft and easy to deform to relatively hard, such as packaging materials, e. g., cardboard, plastic films, aluminum foils, etc. Flexographic printing elements can be prepared from photopolymerisable compositions, such as those described in U.S. Pat. Nos. 4,323,637 and 4,427,759. The photopolymerisable compositions generally comprise an elastomeric binder, at least one monomer and a photoinitiator. Photosensitive elements generally have a layer of the photopolymerisable composition interposed between a support and a coversheet or a multilayer cover element. Upon image-wise exposure to actinic radiation, polymerization, and hence curing (insolublization) of the photopolymerizable layer occurs in the exposed areas.

After imaging, the flexographic printing precursor is developed to remove the uncured material of the layer in the non-exposed areas and reveal the crosslinked relief image in the exposed photosensitive printing element. Typical methods of development include washing with various solvents or water, often with a brush. The disadvantage of this development is the use of solvents which represent a safety and health risk for the operators at the site of the plate making, the generation of liquid waste containing the unpolymerised material and last but not least the additional long drying step after development. Therefore thermal development has been proposed as an improved development process.

Thermal development has the advantage of not requiring an additional drying step after development and thus provides the ability to go more quickly from plate to press. The thermal development processes is based on processing photopolymer printing plates using heat. During this processing, the differential melting temperature between cured and uncured photopolymer is used to develop the latent image. The basic parameters of this process are known, as described in U.S. Pat. Nos. 7,122,295, 6,773,859, 5,279,697, 5,175,072 and 3,264,103 and in WO 01/88615, WO 01/18604, and EP1239329. These processes allow for the elimination of development solvents and the lengthy plate drying times needed to remove the solvent.

However, in order for flexographic printing precursors to be thermally developable, the composition of the photopolymer must be such that there exists a substantial difference in the melting temperature between the cured and uncured parts of the polymer. It is precisely this difference that allows the creation of an image in the photopolymer when heated. Thus, the difference in melting temperature allows the uncured photopolymer to be selectively removed by contacting it with an absorbent material, thereby creating the desired image. This difference seems to be very small and hence the development process lacks some contrast between exposed and unexposed areas of the photopolymer. The cycle of heating and contacting the photosensitive layer may need to be repeated several times in order to sufficiently remove the flowable composition from the un-exposed areas and form a relief structure suitable for printing. Time and absorbent material is thereby wasted. In order to improve the removal of the polymer (clean-out) in the uncured areas without extending the development time, the development temperature can be raised. But raising the development temperature causes more severe distortion of the fine image elements of the plate and of the polymeric support. The process of thermal development further produces a huge amount of solid waste by using the absorbent material. This waste has to be collected and destroyed since recycling the uncured material from the absorbent material is difficult and costly.

Thus there is need for an improved process for preparing relief image printing elements which does not require heat and where an absorbent material is not mandatory to obtain a relief image.

U.S. Pat. No. 6,308,628 discloses a lithographic printing member with a coating having one or more layers containing magnetic particles. Upon imaging by means of ablation, magnetic forces are applied to attract the ablated particles to a desired place or direction avoiding contamination of the optical system which provides the imaging.

US2004/0191572A discloses a radiation curable composition for in-line printing containing magnetic pigments to possess permanent magnetic properties after the composition is cured. The coatings obtained with these compositions provide a substrate with a holding power like magnets and have layer thicknesses below 500 µm.

SUMMARY OF THE INVENTION

Preferred embodiments of the present invention provide a flexographic printing precursor which can be developed by magnetic forces as defined below.

Other preferred embodiments of the present invention provide a process for preparing a flexographic printing precursor which can be developed by magnetic forces as defined below.

Yet other preferred embodiments of the present invention provide a process for making a flexographic printing element by development using magnetic forces as defined below.

Other features, elements, steps, characteristics and advantages of the present invention will become more apparent from the following detailed description of preferred embodiments of the present invention. Specific embodiments of the invention are also defined in the dependent claims.

BRIEF DESCRIPTION OF THE DRAWINGS

FIG. 1 represents a cross section of a preferred embodiment of the present invention wherein:

11 is a support
12 is a photopolymerisable layer
13 is an absorbent material
14 is a magnet

DETAILED DESCRIPTION OF THE PREFERRED EMBODIMENTS

A. Flexographic Printing Precursor

Figure 1:
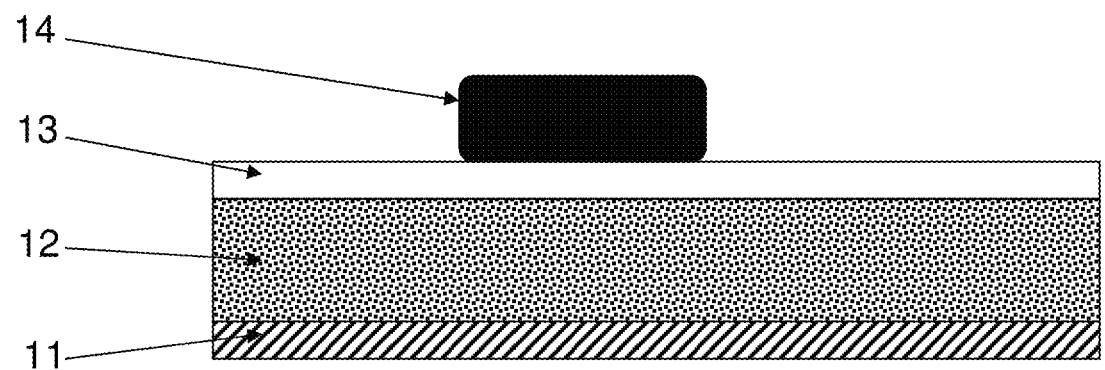
Figure 2:
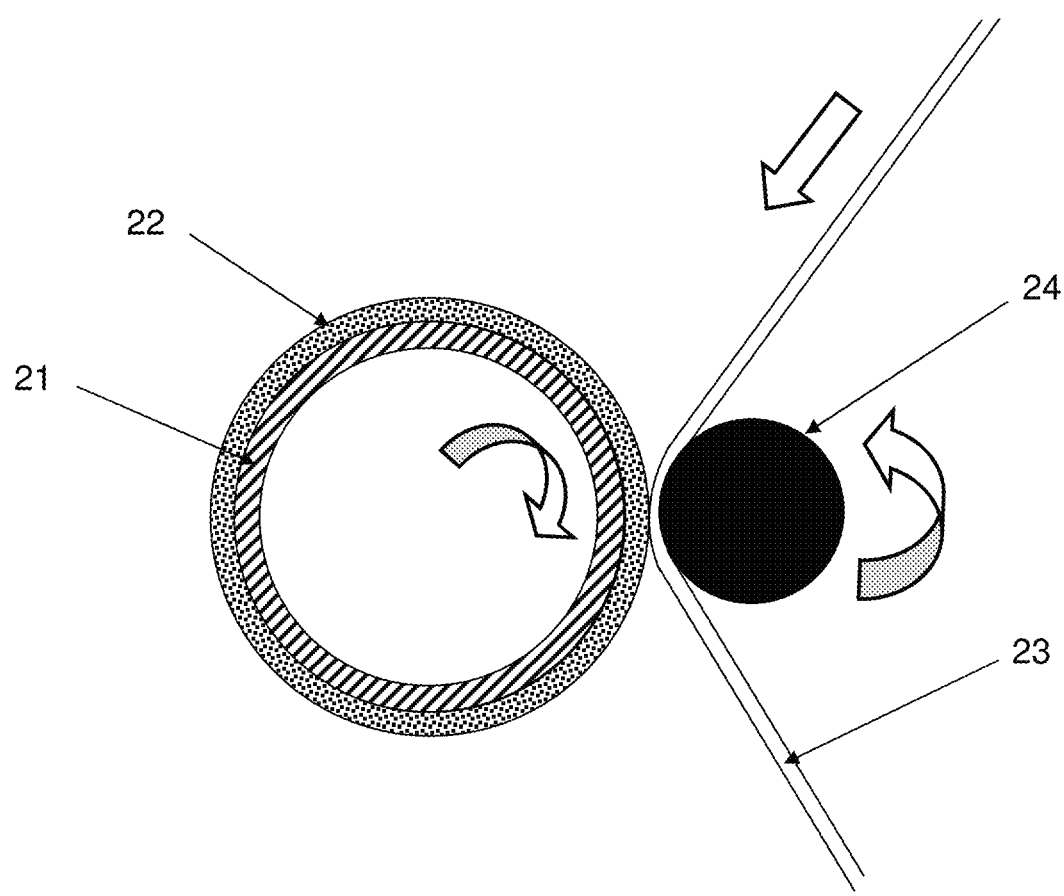
FIG. 2 represents a cross section of a preferred embodiment of the present invention wherein:
21 is a sleeve
22 is a photopolymerisable layer
23 is a web of absorbent material
24 is a roller of magnetic material

The flexographic printing precursor according to a preferred embodiment of the invention comprises a support and a photopolymerisable layer.

A.1. Support

The support for flexographic printing precursor of the invention can be any flexible material which is conventionally used for flexographic printing plates or can be a sleeve. Examples of flexible suitable support materials include polymeric films such those formed by addition polymers and linear condensation polymers, transparent foams and fabrics such as fiberglass, and metals such as aluminium, steel, and nickel or a composite thereof. A preferred support is a polyester film. Particularly preferred is polyethylene terephthalate (PET). The support typically has a thickness from 50 to 300 µm), with a preferred thickness of 76 to 250 µm), more preferred from 76 to 200 µm.

The support may be in sheet form (foil) or in cylindrical form, such as a sleeve. Examples of sleeves are polymeric or metallic cylinders and typically consist of composites, such as epoxy or polyester resins reinforced with glass fibre or carbon fibre mesh. Metals, such as steel, aluminium, copper, nickel, and hard polyurethane surfaces (e.g. durometer 75 Shore D) can also be used. The sleeve may be formed from a single layer or multiple layers of flexible material, as for example disclosed by US2002/466668. Flexible sleeves made of polymeric films can be transparent to ultraviolet radiation and thereby accommodate backflash exposure for building a floor in the flexographic printing precursor. Multiple layered sleeves may include an adhesive layer or tape between the layers of flexible material. Preferred is a multiple layered sleeve as disclosed in U.S. Pat. No. 5,301,610. The basic sleeve may also be made of non-transparent, actinic radiation blocking materials, such as nickel or glass epoxy.

Flexographic printing precursors based on a liquid photopolymerisable layer have preferably glass or polymeric films as PET foils as a support.

The support may optionally bear a subbing layer of an adhesive material or primer to facilitate the adherence of the photopolymerisable layer to the support. Any primer may be used that improves the adhesion between the relief image and the support. Preferred primers have as binder a sulfonated polyester, a polyester polyurethane or a copolymer of vinylidenechloride-methacrylic acid-itaconic acid. Alternatively, the support may be corona treated before applying the photopolymerisable layer.

A.2. Photopolymerisable Layer

As used herein, the term "photopolymerisable" is intended to encompass systems which are photopolymerisable, photocrosslinkable, or photocurable. The photopolymerisable layer of the invention comprises magnetic or magnetisable particles, at least one monomer and an initiator, where the initiator has a sensitivity to heat, infrared radiation or preferably to actinic radiation. In most cases, the initiator will be sensitive to thermal, visible or ultraviolet radiation. The thickness of the photopolymerisable layer can vary over a wide range depending upon the type of printing plate desired. For so called "thin plates" the photopolymerisable layer can be from about 0.5 mm to 1.3 mm in thickness. Thicker plates will have a photopolymerisable layer from 2.5 up to 6.4 mm in thickness or even up to 7.0 mm. Depending on the substrate to be printed, the Shore A hardness of the photopolymerisable layer can vary between 25 and 90, preferably between 45 and 80.

A.2.1. Magnetic and Magnetisable Particles

Suitable magnetisable material according to a preferred embodiment of the present invention includes particles of Fe, Ni, Co, alloys thereof, iron oxide, and chromium dioxide. Suitable magnetic particles for use in the present invention are Alnico alloys, ceramic, rare-earth alloys and iron-chromium-cobalt alloys. Examples are disclosed in US2004/0191572A.

The size of the particles is preferably between 1 and 200 µm, more preferably lower than 50 µm, most preferably lower than 10 µm.

The amount of the magnetic or magnetisable particles in the photopolymerisable layer is preferably between 10 and 80 (wt.)%, more preferably between 15 and 60 (wt.)%, most preferably between 15 and 50 (wt) %.

A.2.2. Monomer

Monomers that can be used in the photopolymerisable layer of the invention are well known in the art and include but are not limited to addition-polymerization ethylenically unsaturated compounds with at least one terminal ethylenic group. Generally the monomers have relatively low molecular weights (less than about 30, 000). Preferably, the monomers have a relatively low molecular weight less than about 5000. Examples of suitable monomers include, but are not limited to, t-butyl acrylate, lauryl acrylate, the acrylate and methacrylate mono- and poly-esters of alcohols and polyols such as alkanols, such as hexanediol diacrylate and hexanediol dimethacrylate; alkylene glycols, such as ethylene glycol diacrylate, ethylene glycol dimethacrylate, and diethylene glycol diacrylate; trimethylol propane, such as trimethylol propane triacrylate; ethoxylated trimethylol propane; pentaerythritol; dipentaerythritol; polyacrylol oligomers, and the like. A mixture of monofunctional and multifunctional acrylates or methacrylates may be used. Other examples of suitable monomers include acrylate and methacrylate derivatives of isocyanates, esters, epoxides and the like.

Additional examples of monomers include, but are not limited to acrylated liquid polyisoprenes, acrylated liquid polybutadienes, liquid polyisoprenes with high vinyl content, and liquid polybutadienes with high vinyl content, (that is, content of 1, 2-vinyl groups is greater than 20% by weight).

Beside monomers, useful in radical polymerisation reactions, monomers normally used in cationically polymerisable compositions can be used in the present photopolymerisable layer. Preferred monomers include cyclic ethers, especially epoxides and oxetanes, and also vinyl ethers and hydroxy-containing compounds. Lactone compounds and cyclic thioethers as well as vinyl thioethers can also be used. More preferred are epoxides, such as aromatic, aliphatic or cycloaliphatic epoxy resins. These are compounds having at least one, preferably at least two, epoxy group(s) in the molecule. A preferred class of monomers and oligomers are vinyl ether acrylates such as those described in U.S. Pat. No.

6,310,115, incorporated herein by reference. Particularly preferred compounds are 2-(2-vinyloxyethoxy)ethyl (meth) acrylate, most preferably the compound is 2-(2-vinyloxyethoxy) ethyl acrylate. Preferred oxetane compounds suitable as monomer, oligomer and prepolymer in the radiation curable compositions and inks according to the present invention can be found in US 20050119362. The oxetane compounds listed in [0063] to [0120] are incorporated herein by specific reference. It is preferred to combine an epoxy compound and an oxetane compound to raise the reaction rate Examples of suitable monomers have been disclosed in WO2014/095361 [p. 15, 1. 30-p. 20 1.21]. Other examples of particularly suitable monomers can be found in U.S. Pat. Nos. 4,323,636, 4,753,865, 4,726,877 and 4,894,315.

A.2.3. Initiator

The initiator can be any single compound or combination of compounds which is sensitive to heat, infrared radiation or actinic radiation and generating free radicals which initiate the polymerization of the monomer or monomers without excessive termination. The initiator is preferably sensitive to visible or ultraviolet radiation, preferably to ultraviolet radiation.

A combination of two or more initiators may be used. An initiator system, comprising an initiator and a co-initiator, may also be used. A suitable initiator system comprises an initiator, which upon absorption of actinic radiation forms free radicals by hydrogen abstraction or electron extraction from a second compound, the co-initiator. The co-initiator becomes the actual initiating free radical.

Any of the known classes of initiators, particularly free radical photo-initiators such as quinones, benzophenones, benzoin ethers, aryl ketones, peroxides, phosphine oxides, biimidazoles, benzyl dimethyl ketal, hydroxyl alkyl phenyl acetophenone, and dialkoxy actophenone, may be used. Alternatively, the photoinitiator may be a mixture of compounds, one of which provides the free radicals when caused to do so by a sensitizer activated by radiation.

Examples of suitable initiators are disclosed in EP-A 1637926 paragraph [0077] to [0079], U.S. Pat. Nos. 4,323, 637, 4,427,749 and 4,894,315.

To avoid extraction of the initiator out of the flexographic printing master during printing, copolymerizable photo-initiators (and/or co-initiators) such as disclosed in WO2012/084811 may be used.

If monomers suitable for cationic polymerisation are selected for the photopolymerisable layer, the typical initiators to be combined with are compounds, which form aprotic acids or Bronstead acids upon exposure to ultraviolet and/or visible light sufficient to initiate polymerization. Examples of suitable cationic photo-initiators are aryldiazonium salts, diaryliodonium salts, triarylsulphonium salts, triarylselenonium salts and the like.

Suitable commercial cationic photoinitiators include R-gen™ 1130, R-gen™ BF-1172, R-gen™ 261, Chivacure™ 1176 and Chivacure™ 1190 from Chitec Technology Co., Ltd.; Irgacure™ 250 from Ciba Specialty Products; UV9387C and UV9380C from GE Silicones; Cyracure™ Photoinitiator UVI-6976 and UVI-6992 from The Dow Chemical Company; Omnicat™ series from IGM Resins, including Omnicat 432™ (sulfonium type), Omnicat™ 440 (iodonium type), Omnicat™ 445 (iodonium type), Omnicat™ 550 and Omnicat™ 650 (polymeric type); Esacure™ 1064, Esacure™ 1187 and Esacure™ 1188 from Lamberti S.p.A.; Adeka Optomer™ SP series of aromatic sulfonium types cationic photo-initiations from Adeka Corporation, e.g. Adeka Optomer™ SP-152; and OMPH076 from ABCR Gmbh & Co. KG, a blend of an aromatic sulfonium and aromatic thioether (available by B & S Specialties BV under the tradename Sarcat KI85). Other suitable photo-initiators are disclosed in CRIVELLO, J. V., et al. VOLUME III: Photoinitiators for Free Radical Cationic & Anionic Photopolymerization. 2ndth edition. Edited by BRADLEY, G. London, UK: John Wiley and Sons Ltd, 1998.

A preferred total amount of initiator is 0.001 to 10 wt %, more preferably 2.5 to 7.5 wt %, of the total curable fluid weight.

A.2.4. Elastomeric Binder

The photopolymerisable layer of the present invention may preferably contain an elastomeric binder. The elastomeric binder can be a single polymer or mixture of polymers. Binders include natural or synthetic polymers of conjugated diolefin hydrocarbons, including polyisoprene, 1, 2-polybutadiene, 1, 4-polybutadiene, butadiene/acrylonitrile, thermoplactic polyurethane, EPM, EPDM and PEBA (polyethylene block amine). Preferably, the elastomeric binder is an elastomeric block copolymer of an A-B-A type block copolymer, where A represents a non-elastomeric block, preferably a vinyl polymer and most preferably polystyrene, and B represents an elastomeric block, preferably polybutadiene or polyisoprene. Most preferred thermoplastic elastomeric binders are poly-(styrene/isoprene/styrene) block copolymers. The non-elastomer to elastomer ratio in the A-B-A block copolymer is preferably in the range of from 10:90 to 35:65. It is preferred that the binder be present in an amount of at least 60% by weight of the photosensitive layer.

A.2.5. Additives

The photopolymerisable layer may further contain oligomers, plasticizers, surfactants, inhibitors and colorants. Suitable examples of these additives can be found in WO2014/095361 (p. 16 1.20-p. 21 1.24; p. 25 1. 15-p. 26 1. 3). It has been found if a polyacrylol oligomer is used, the oligomer should preferably have a molecular weight greater than 1000. Processing aids, antioxidants and antiozonants. Processing aids may be such things as low molecular weight polymers compatible with the elastomeric block copolymer, such as low molecular weight alpha-methylstyrene polymer or copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

A.3. Laser Ablatable Layer

The photopolymerisable layer can be image wise exposed to actinic radiation via a mask or directly via a beam such as a laser beam. The mask can be imaged via ablation of a laser ablatable layer which is opaque to actinic irradiation and which is present on the photopolymerisable layer at the side opposite to the support.

The laser ablatable layer according to the invention may substantially cover the surface or only cover an imaginable portion of the photopolymerisable layer. The laser ablatable layer is substantially opaque to actinic radiation and preferably is sensitive to infrared radiation. The laser ablatable layer can be used with or without a barrier layer. If used with a barrier layer, the barrier layer is disposed between the photopolymerisable layer and the laser ablatable layer. The laser ablatable layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers, non-self-oxidizing polymers, thermochemically decomposable polymers, polymers and copolymers of butadiene and isoprene with styrene and/or olefins, pyrolyzable polymers, amphoteric co-polymers, polyethylene wax, materials conventionally used as the release layer described below, and combinations thereof.

The thickness of the laser ablatable layer should be in a range to optimize both sensitivity and opacity, which is generally from about 2 nm to about 50 µm. The laser ablatable layer should have a transmission optical density of greater than 2.0 in order to effectively block actinic radiation and the polymerization of the underlying photopolymerisable layer. The laser ablatable layer is image wise removed by ablation or vaporisation and forms an in-situ mask as disclosed in U.S. Pat. Nos. 5,262,275, 5,719,009, EP0741330A, U.S. Pat. Nos. 5,506,086 and 5,705,310.

A.4. Barrier Layer and Release Layer.

The flexographic printing precursor of the invention may further comprise one or more additional layers on the photopolymerizable layer, opposite to the support. Additional layers include a release layer, a laser ablatable layer (see above) a barrier layer, and a layer which alters the surface characteristics of the photosensitive element. One additional layer may provide multiple functions for the printing precursor. One or more of the additional layers can cover the photopolymerisable layer. If the laser ablatable layer is present, at least one barrier layer may be interposed between the photopolymerisable layer and the laser ablatable layer. If present, the barrier layer minimizes migration of materials between the photopolymerisable layer and the radiation opaque layer. Monomers and plasticizers can migrate over time if they are compatible with the materials in an adjacent layer. Such migration can occur, for example, from the photopolymerisable layer into the laser ablatable layer. In such instances, the infrared sensitivity of the laser ablatable layer may be altered. In addition, such migration can cause smearing and tackifying of the radiation opaque layer after imaging.

Since the surface of the photopolymerisable layer may be tacky, a release layer having a substantially non-tacky surface can be applied to the surface of the photopolymerisable layer opposite to the support. Such release layer can protect the surface of the photopolymerisable layer from being damaged during removal of an optional temporary coversheet and can ensure that the photopolymerisable layer does not stick to the coversheet. During exposure to actinic radiation, the release layer can prevent the phototool, from binding with the photopolymerisable layer. The release layer is insensitive to actinic radiation. The release layer must be flexible, transparent, and non-tacky. A thin layer, preferably having a thickness of at least 0.5 microns, but less than 10 microns, more preferably less than 4 microns, is suitable. The release layer preferably is removable by contact with an absorbent material in the range of acceptable developing temperatures for the flexographic printing element used. Examples of suitable materials for the release layer are well known in the art, and include polyamides, polyvinyl alcohol, hydroxyallyl cellulose, copolymers of ethylene and vinyl acetate, amphoteric interpolymers, and combinations thereof. An example of a suitable release layer is disclosed in EP0665471. The release layer is also suitable as a first embodiment of the barrier layer which is optionally interposed between the photopolymerisable layer and the laser ablatable layer.

It is also contemplated that digital mask formation can be accomplished by image-wise application of the radiation opaque material in the form of one or more inkjet inks. Image-wise deposition of an ink-jet ink can be directly on the photopolymerisable layer or disposed above the photopolymerisable layer on another layer of the photosensitive element. Another contemplated method of digital mask formation can be accomplished is by creating the mask image of the radiation opaque layer on a separate carrier and then transferring with application of heat and/or pressure to the surface of the photopolymerisable layer opposite to the support. The photopolymerisable layer is typically tacky and will retain the transferred image. The separate carrier can then be removed from the element prior to image-wise exposure. The separate carrier may have a radiation opaque layer that is image-wise exposed to laser radiation to selectively remove the radiation opaque material and form the image.

B. Method of Preparing the Flexographic Printing Precursor

The photopolymerisable layer can be prepared in many ways by mixing the magnetic or magnetisable particles with the monomer, initiator, elastomeric binder and other ingredients. Optionally, the obtained dispersion can be further homogenised using high shear homogenisers or ball mills. It is preferred that the photopolymerisable dispersion is formed into a hot melt and then calandered to the desired thickness. An extruder can be used to perform the functions of melting, mixing, deaerating, and filtering the dispersion. The extruded dispersion is then calandered between the support and a coversheet. Alternatively, the photopolymerisable dispersion can be placed between the support and the coversheet in a mold. The layers are then pressed flat by the application of heat and/or pressure.

Alternatively the coversheet can be temporary and previously coated with a barrier layer. In the latter case it is arranged so that the barrier layer is next to the photopolymerisable layer during the calandering process. The adhesion between the barrier layer and the temporary coversheet should be low, so that the barrier layer will remain intact on the photopolymerisable layer when the temporary coversheet is removed.

The laser ablatable layer is generally prepared by coating the material onto a second temporary coversheet. The laser ablatable layer can be applied using any known coating technique including spray coating. It also can be applied by vapour deposition under vacuum or by sputtering. The last methods are particularly useful for metal layers.

The adhesion of this second temporary coversheet should also be low so that the sheet is easily removed. The laser ablatable layer can then be over-coated with the barrier layer or the two layers can be coated simultaneously. The final element is prepared by (1) removing the temporary coversheet from the photopolymerizable layer and placing it together with the second element (second temporary coversheet/laser ablatable layer) such that the barrier layer is adjacent to the photopolymerisable layer; or (2) removing the temporary coversheet from the barrier layer on the photopolymerisable layer and placing it together with the second element (second temporary coversheet/infrared-sensitive layer) such that the infrared-sensitive layer is adjacent to the barrier layer. This composite element is then pressed together with moderate pressure. The second temporary coversheet can remain in place for storage, but must be removed prior to IR laser imaging.

Alternatively, the three layers can all be prepared on temporary coversheets: the photopolymerisable layer by extrusion and calendering or pressing in a mold; the barrier and laser ablatable layers by coating.

A bi-layer or multilayer photopolymerisable layer can be made by laminating using conventional techniques or by co-extrusion (see U.S. Pat. No. 5,049,478).

An alternative process of making flexographic printing precursors involves the use of liquid photopolymerisable compositions comprising magnetic or magnetisable particles at the plate making site. One of the advantages of making flexographic printing elements from liquid photopolymerisable compositions or dispersions, is that the uncured material can be reclaimed from the non-exposed areas of the printing elements and used to make additional printing plates. Liquid photopolymerisable compositions have a further advantage as compared to flexographic printing precursors based on solid photopolymerisable layers in terms of flexibility to enable the production of any required plate thickness simply by changing the machine settings.

C. Method of Making a Flexographic Printing Element

C.1. Image-Wise Exposure

The photopolymerisable layer can be image wise exposed to actinic radiation via a mask or directly via a beam such as a laser beam. The mask can be obtained by image wise irradiation of a light or thermal sensitive recording media such as a graphic arts film so as to obtain transparent areas and opaque areas to actinic radiation. This image-bearing mask is also called the phototool. The flexographic printing precursor will not initially include the phototool. The phototool can form a package with the flexographic printing precursor such that the layer containing transparent areas and opaque areas to actinic radiation is adjacent to the surface of the flexographic printing precursor opposite the support, which is typically the photopolymerisable layer. If present, the coversheet associated with the photosensitive element typically is removed prior to forming the package.) As a result of the image-wise transfer process, only the transferred areas of the radiation opaque layer will reside on the photosensitive element forming the in-situ mask.

Alternatively the mask can be obtained via ablation of a laser ablatable layer which is opaque to actinic radiation and which is present on the photopolymerisable layer at the side opposite to the support.

Infrared laser exposure for forming the in-situ mask from the laser ablatable layer can be carried out using various types of infrared lasers, which emit in the range 750 to 20,000 nm. Infrared lasers including diode lasers emitting in the range from 780 to 2,000 nm and Nd:YAG lasers emitting at 1064 nm are preferred. A preferred apparatus and method for infrared laser exposure to image-wise remove the actinic radiation opaque layer from the photosensitive element is disclosed in U.S. Pat. Nos. 5,760,880 and 5,654,125. The in-situ mask images remain on the photosensitive element for subsequent steps of overall exposure to actinic radiation and may optionally remain on during the development process.

Image wise expose of the flexographic printing precursor can be done on a flat surface or with the precursor mounted on a drum. In the case of a flexographic printing precursor having a sleeve as support, the sleeve is brought onto a drum or mandrel. The presence of magnetic or magnetisable particles in the photopolymerisable layer makes it possible to fix the flexographic printing precursor onto the drum or mandrel of the imaging apparatus if the drum is made magnetic.

The next step in the process of the invention is to overall expose the photosensitive element to actinic radiation through a mask to image-wise expose the photopolymerisable layer. The mask can be a phototool or an in-situ image formed from the laser ablatable layer disposed above the photopolymerisable layer. Areas of the photopolymerisable layer that are exposed to radiation chemically crosslink and cure. Areas of the photopolymerisable layer that are blocked from exposure to the radiation remain uncured.

The cured exposed areas are not able to melt, even at elevated temperatures, and are insoluble in flexographic printing inks under normal conditions. "Normal" conditions include flexographic plate temperatures of between about 12° C. and 31° C. After image-wise exposure of the photosensitive element with the phototool, the phototool is removed prior to thermal treating of the photosensitive element. For flexographic printing precursors having the in-situ mask image, the mask can be removed prior to the development process. Actinic radiation of any origin and type can be used in the photopolymerisation process, and is preferably ultraviolet radiation. Actinic radiation sources encompass the ultraviolet and visible wavelength regions. The suitability of a particular actinic radiation source is governed by the photosensitivity of the initiator and the at least one monomer used in preparing the flexographic printing elements. The preferred photosensitivity of most common flexographic printing elements are in the UV and deep UV area of the spectrum, as they afford better room-light stability. The radiation can emanate from point sources or be in the form of parallel rays or divergent beams. Examples of suitable visible or ultraviolet sources include carbon arcs, mercury-vapour arcs, fluorescent lamps, electron flash units, electron beam units, photographic flood lamps and LED's. The most suitable sources of ultraviolet radiation are fluorescent lamps and the mercury-vapour lamps, particularly sun lamps. These radiation sources generally emit long-wave UV radiation between 310-400 nm.

The actinic radiation exposure time can vary from a few seconds to minutes, depending upon the intensity and spectral energy distribution of the radiation, its distance from the photosensitive element, and the nature and amount of the composition of the photopolymerisable layer. Exposure temperatures are preferably ambient or slightly higher, i. e., about 20° C. to about 45° C. Anyway, the conditions of exposure to actinic radiation must be conducted in such a way that at least partial curing and/or crosslinking of the photopolymerisable layer occurs.

Image-wise exposure of the flexographic printing element to actinic radiation may be conducted in the presence or absence of atmospheric oxygen for photosensitive elements having an in situ mask. Atmospheric oxygen is eliminated when the exposure is conducted in a vacuum. The exposure may be conducted in a vacuum to minimize the effects of oxygen on the polymerization reactions occurring in that layer. And for flexographic printing precursors that are exposed through a phototool, the exposure must be conducted in vacuum to assure good contact between the phototool and the photosensitive element.

Flexographic printing precursors typically formed by placing a layer of a liquid photopolymerisable composition on a support at the plate making site are exposure to actinic radiation, such as UV light through a mask or phototool. The result is that the liquid photopolymerisable composition is selectively cross-linked and cured to form a printing image surface. Upon exposure to actinic radiation, the liquid photopolymer resin polymerizes and changes from a liquid state to a solid state to form a relief image. After the process is complete, non-cross-linked photopolymerisable liquid can be recovered.

Various processes have been developed for producing flexographic printing elements from liquid photopolymerisable liquids as described, for example, in U.S. Pat. Nos.

5,213,949, 5,813,342 and US 2008/0107908, the subject matter of each of which is herein incorporated by reference in its entirety.

After relief exposure, the uncured material can be recovered. In a typical process, the uncured material is physically removed from the plate in a reclamation step such that it can be reused to make further plates. It is an additional advantage of this invention that the uncured photopolymerisable liquid comprising magnetisable particles can be removed in a magnetic field and can be transferred to an absorbent placed in between the surface of the liquid photopolymerisable layer and the magnet. In all areas not exposed to actinic radiation, the photopolymerisable composition remains liquid after exposure and can then be reclaimed. This reclamation step saves material costs.

The process according to a preferred embodiment of the invention may also include a back exposure or backflash step. This is a blanket exposure to actinic radiation through the support. It is used to create a shallow layer of polymerized material, or a floor, on the support side of the photopolymerisable layer and to sensitize the photopolymerisable layer. The floor provides improved adhesion between the photopolymerisable layer and the support and establishes the depth of relief for the plate. The backflash exposure can take place before, after, or during the other imaging step. Generally, it is preferred that the backflash exposure takes place just prior to the image-wise exposure. However, for photosensitive elements exposed through a phototool and thermally treated, it is preferred that the backflash exposure takes place after image-wise exposure. Any of the conventional radiation sources discussed above can be used for the backflash exposure step. Backflash time generally ranges from a few seconds up to about a few minutes.

The image-wise exposed flexographic printing precursor is then ready for the next step of the present process which is the magnetic development process.

C.2. Magnetic Development Process

The image-wise exposed flexographic printing precursor is then brought in a magnetic field. The magnetic field must have a magnitude and direction suitable to remove at least partially the photopolymerisable layer in the non-exposed areas of the photopolymerisable layer.

The material from the areas of the photopolymerisable layer which have been exposed to actinic radiation have been cured or crosslinked and will hence not move or move much slower in the applied magnetic field. Due to the magnetic field, the material of the photopolymerisable layer in the non-exposed areas of the flexographic printing plate precursor will move or flow to the surface of the body which contains the source of the magnetic field: the magnetic development body.

For flexographic printing plate precursors it is preferred that the magnetic development body comprises a smooth surface and that the precursor is contacted with this smooth surface to guarantee a good adhesion over the whole surface of the surface of the flexographic printing plate precursor, which is the photopolymerisable layer or an additional layer on top of this photopolymerisable layer. With a smooth surface is meant, a surface which is not rough or which does not have any defects such as bumps, ridges, or uneven parts. If the surface of the magnetic development body is not smooth the development process can be locally different and this may be visible in resulting printed image. This smooth surface can be obtained by means of a rigid plate or block of material consisting of glass, ceramics, aluminium, permanent magnetic material such a magnetic rubber foils of flexible magnetic material fixed to the rigid plate or block. The surface of the magnetic development body can be polished to further improve adhesion and improve the homogeneous deposition of the uncured photopolymerisable material.

In another preferred embodiment of the invention, the flexographic printing plate precursor can also be contacted with a roll or bar having a smooth surface and made of magnetic material as described below.

For flexographic printing precursors on a sleeve as a support it is preferred that the precursor is contacted with a roll having a smooth surface and made of magnetic material as described below.

In another embodiment of the invention, the plate, block or roll from the magnetic development body can also been made of permanent magnetic material such as ferrite, Samarium-Cobalt alloys, Aluminium-Nickel-Cobalt alloys and Neodymium-Iron-Boron. As the magnetic development process can be combined with a thermal development process, preferably magnetic materials which are resistant to high temperatures such as Samarium-Cobalt and Aluminium-Nickel-Cobalt alloys are to be used. In another embodiment, one or more permanent magnets can be glued to the rigid plate with a glue, more preferably a heat resistant glue, on a side of the rigid plate opposite to the side to which the flexographic printing plate precursor is adhered. It is possible to use several groups of magnets glued to the plate or block of the magnetic development body in order to obtain a large and homogeneous magnetic field to guarantee a strong magnetic attraction of the material from the non-exposed areas of the photopolymerisable layer.

The magnetic development body may also comprise electromagnets which are able to magnetise the block or rigid plate forming the surface to which flexographic printing plate precursor is adhered to. One of the advantages of electromagnets is that electromagnets do not lose their magnetic properties upon heating.

The time to completely remove uncured material from the non-exposed areas of the photopolymerisable layer depends on the thickness of the photopolymerisable layer, the presence of additional layers, the composition of the photopolymerisable layer and the temperature. After sufficient time in order to move all uncured material to the surface of the magnetic development body, the contact between both surfaces is interrupted, preferably with the magnetic field still present, and is taking away the uncured material leaving a support with a relief. The uncured material adhering to the surface of the magnetic development body can afterwards been removed for recycling purposes or waste treatment.

In another preferred embodiment of the invention, the surface of the flexographic printing precursor opposite to the support can at least partially be covered with an absorbent material during the magnetic development process. Due to the absorbent material an improved transfer of uncured material is obtained and moreover, it is much easier to remove all uncured material since it does not adhere to the surface of the magnetic development body. The absorbent material is selected from non-woven materials, paper stocks, fibrous woven material, open-celled foam materials, porous materials that contain more or less a substantial fraction of their included volume as void volume. The absorbent material can be in web or sheet form. Preferred is a non-woven nylon web.

Intimate contact of the absorbent material to the photopolymerisable layer may be maintained by pressing the layer and the absorbent material together. It is desirable to apply a substantially uniform pressure. Pressure is applied to force the absorbent material into intimate contact with the photopolymerisable layer. After sufficient time, while still a magnetic field is present, the absorbent material together with the surface of the magnetic development body is separated from the cured layer in contact with the support (if a back exposure was performed) or from the support to reveal the relief structure.

In another preferred embodiment of the invention, the magnetic development can be combined with thermal development. The thermal treating steps of heating the photopolymerisable layer and contacting the layer with an absorbent material can be done at the same time, or in sequence provided that the material of the non-exposed areas of the photopolymerisable layer are still soft or in a melt state when contacted with the absorbent material. The photopolymerisable layer can be heated by conduction as in US 2003/0211423 A1, convection, radiation, or other heating methods to a temperature sufficient to effect melting of the material in the non-exposed areas but not so high as to effect distortion of the exposed areas of the layer. The photopolymerisable layer can be heated to a surface temperature from about 40° C. to about 200° C., preferably from 100 to 160° C. in order to cause melting or flowing of the non-exposed areas. The absorbent material contacts the surface of the photopolymerisable layer of the heated photosensitive element, and absorbs the softened or molten or flowing uncured material from the unexposed areas, forming a flexographic printing element in which the uncured material is removed to form a relief pattern or surface. The absorbent material is selected such as to have a melt temperature exceeding the melt temperature of the uncured material in the non-exposed areas of the photopolymerisable layer and having good tear resistance at the same operating temperatures. Preferably, the selected material withstands temperatures required to process the flexographic printing precursor during heating.

Preferred absorbent materials utilized to remove the uncured areas of the photopolymerisable layer from the cured areas of the layer are selected from absorbent materials which possess internal strength and tear resistance to temperatures up to, including and slightly beyond the melting temperature of the uncured photopolymerisable material. The absorbent materials should also possess a high absorbency for the molten photopolymerisable layer composition. Preferred is a non-woven nylon web.

By maintaining more or less intimate contact of the absorbent material with the photopolymerisable layer that is molten in the uncured areas, a transfer of the uncured photosensitive material from the photopolymerisable layer to the absorbent material takes place. While still in the heated condition and/or in the presence of the magnetic field, the absorbent material is separated from the cured photopolymerisable layer in contact with the support (if a backflash exposure has been performed) or from the support, to reveal the relief structure of the flexographic printing element. A cycle of the steps of heating the photopolymerisable layer and contacting the photopolymerisable layer with an absorbent material can be repeated as many times as necessary to adequately remove the all the uncured material from the non-exposed areas and create sufficient relief depth. However, it is desirable to minimize the number of cycles for suitable system performance.

Preferably the surface to which the flexographic printing precursor (plate, block, roll as described above) is contacted with during the development can be heated to obtain thermal development.

After complete or partial removal of the photopolymerisable layer in the non-exposed areas of the printing plate precursor due to the applied magnetic field, a flexographic printing element is obtained.

C3. Post Treatment

The flexographic printing elements of the invention can be uniformly post-exposed to ensure that the photopolymerisation process is complete and that the plate or sleeve will remain stable during printing and storage. This post-exposure step utilizes the same radiation source as the main exposure. De-tackification (light finishing) is an optional post-development treatment that can be applied if the surface is still tacky, such tackiness not generally being removed by post exposure.

The presence of the magnetic or magnetisable particles in the photopolymerisable layer can further help to fix the flexographic printing plate or sleeve onto the printing cylinder of a flexographic printing press when this is made magnetic.

While the present invention will hereinafter in the examples be described in connection with preferred embodiments thereof, it will be understood that it is not intended to limit the invention to those embodiments.

EXAMPLES

Materials
PHOTOMER 4017 F=1,6-hexanediol diacrylate from IGM RESINS
KRATON D1161NS a SIS thermoplastic elastomer having 15 (wt) % of styrene from SHELL
KRATON D1163NS a SIS thermoplastic elastomer having 15 (wt) % of styrene from SHELL
KRATON D1165NS a SIS thermoplastic elastomer having 30 (wt) % of styrene from SHELL
KRATON D1155ES a SBS thermoplastic elastomer having 40 (wt) % of styrene from SHELL
SR339C a 2-phenoxyethyl acrylate monomer from SARTOMER
SR351 a trimethylolpropane triacrylate from SARTOMER
SR531 a cyclic trimethylolpropane formal acrylate from SARTOMER
SR9035 an ethoxylated trimethylolpropane triacrylate from SARTOMER
OMNIMER ACMO a acryloyl morpholine from IGM RESINS
CD278 2-(2-butoxyethoxy)ethyl acrylate from SARTOMER
BYK UV 3510 a polyether modified polydimethylsiloxane from BYK
VERBATIM HR50 a liquid photopolymer from CHEMENCE
BHT=2,6-di-t-butyl-4-methylphenol, an inhibitor from ALDRICH
IRGACURE 127 a photo-initiator from CIBA-GEIGY
IRGACURE 819 a photo-initiator from CIBA-GEIGY
IRGACURE 651 a photo-initiator from CIBA-GEIGY
IRON PARTICLES from ALDRICH (Nr.209309, size=44 µm)
PET: 100 µm coated with a primer containing 113 mg/m$^2$ Copol (ViCl2-MA-IA), 26.5 mg/m$^2$ Kieselsol 100F, 0.750 mg/m$^2$ Mersolat H40 and 4 mg/m$^2$ Ultravon W Copol (ViCl2-MA-IA), a copolymer of vinylidenechloride-methacrylic acid and itaconic acid; from Agfa Gevaert.
Mersolat H40, a surfactant from Lanxess.

Kieselsol 100F, a silica from Bayer
Ultravon W, a surfactant from Ciba-Geigy
Silicone spacer having thicknesses of 2.0, 1.0 and 0.5 mm from James Walker
polyester/Silicone release layer: Persalic-L-36 film (36 µm PET film from Perlen Converting coated on one side with a silicone release agent)
Absorbent: basic paper 2 Ply from Tork Methods Exposure to Actinic Radiation Exposure to UV-A radiation was carried out in a UV-A light box equipped with 8 Philips TL 20W/10 UVA ($\lambda_{max}$=370 nm) lamps and filled with nitrogen gas. The distance between the lamps and the sample was approximately 10 cm. UV-C post curing was carried out with a light box equipped with 4 Philips TUV lamps ($\lambda_{max}$=254 nm). Post curing was performed under nitrogen gas. The curing time was 5 minutes.

Measurement of Shore A Hardness

Samples coated on PET so as to obtain a thickness of 3.0 mm thick after drying were exposed to UV-A as described above. The curing time was 10 minutes followed by curing for 10 minutes from the backside with the same exposure device. The UV-C post curing was carried out with a light box, as described above, under nitrogen for 5 minutes. The Shore A hardness was measured with a Shore Durometer, having a sharp indentor point with a load of 12.5 N. The scale readings range from 0 (0.1 inch penetration) to 100 (zero penetration).

Flexibility

The flexibility level of the samples was determined by bending the samples 180° and given a rating number from 0 to 3 (0 meaning high resistance to bending, 3 meaning low resistance to bending).

Example 1

This example illustrates the magnetic development properties obtained with curable compositions comprising at least one elastomeric binder and iron particles as magnetisable particles.

Photopolymerisable Layer

Photopolymerisable compositions were prepared by mixing compounds listed in Table 1 at room temperature, followed by a heating at 50° C. until complete dissolution.

TABLE 1

|  | S-1 | S-2 | S-3 | S-4 | S-5 | S-6 | S-7 | S-8 |
|---|---|---|---|---|---|---|---|---|
| Photomer 4017 F | 24 g | 24 g | 24 g | 24 g | 24 g | 24 g | 24 g | 24 g |
| Kraton D1161NS |  |  |  |  | 35 g |  |  | 71 g |
| Kraton D1163NS |  |  |  | 35 g |  |  | 71 g |  |
| Kraton D1165NS |  |  | 35 g |  |  | 71 g |  |  |
| Kraton D1155ES | 35 g |  |  |  | 71 g |  |  |  |
| Irgacure 651 | 1 g | 1 g | 1 g | 1 g | 1 g | 1 g | 1 g | 1 g |
| MEK | 40 g | 40 g | 40 g | 40 g | 40 g | 40 g | 40 g | 40 g |

After complete dissolution of the compounds and cooling to room temperature, each of the compositions was divided in 3 aliquot parts. To one aliquot part of each composition S-1 to S-8, iron particles were added to obtain an iron content of 15.0 (wt) %. To a second aliquot part of each composition S-1 to S-8, iron particles were added to obtain an iron content of 50.0 (wt) %.

Flexographic Printing Precursor

The curable compositions without iron particles, with 15 (wt) % iron particles and with 50 (wt) % iron particles were heated to a temperature of 45° C. On a PET foil, a silicone spacer of 1.0 mm thickness was placed to form a rectangular receptacle and this was subsequently filled with the heated curable composition. The excess of liquid was removed by a clean cut metal blade. The coated layer was then left to dry for 2 hours at 45° C. such as to obtain a solid photopolymerisable layer on a PET support. The obtained flexographic printing precursors are summarised in Table 2.

TABLE 2

| Curable composition | Fe-content (wt) % | Flexographic printing precursor |
|---|---|---|
| S-1 | 0 | FPP-01 |
| S-2 | 0 | FPP-02 |
| S-3 | 0 | FPP-03 |
| S-4 | 0 | FPP-04 |
| S-5 | 0 | FPP-05 |
| S-6 | 0 | FPP-06 |
| S-7 | 0 | FPP-07 |
| S-8 | 0 | FPP-08 |
| S-2 | 15.0 | FPP-9 |
| S-3 | 15.0 | FPP-10 |
| S-4 | 15.0 | FPP-11 |
| S-6 | 15.0 | FPP-12 |
| S-7 | 15.0 | FPP-13 |
| S-8 | 15.0 | FPP-14 |
| S-1 | 50.0 | FPP-15 |
| S-2 | 50.0 | FPP-16 |
| S-3 | 50.0 | FPP-17 |
| S-4 | 50.0 | FPP-18 |
| S-5 | 50.0 | FPP-19 |
| S-6 | 50.0 | FPP-20 |
| S-7 | 50.0 | FPP-21 |
| S-8 | 50.0 | FPP-22 |

Image wise exposure of the flexographic printing precursor.

The flexographic printing masters were partially covered by 2 PET foils having on top a cardboard, both having a size of 10 mm×10 mm. The thickness of the cardboard is such that the UV optical density is higher than 3.0. The flexographic printing precursor with its cardboard mask was exposed through the mask of cardboard to UV-A radiation as described above.

Magnetic Development

Magnetic development of the image wise exposed flexographic printing precursors was performed by means of a Kodak Creo Trendsetter drum clamp (part: 50-1091A, ASSY, mech, north magnetic clamp). As the samples were placed horizontally, the magnet was contacted with the image recording layer and moved vertically away from the surface thereby removing material from the non-exposed areas. The material removed form the non-exposed areas sticks to the surface of the magnet and is separated from the support. The magnetic development level, as observed visually, has been given a rating number from 0 to 5 (0 meaning no removal of material from the non-exposed areas, 5 meaning full removal of the material from the non-exposed areas). The magnetic development level of the non-exposed areas of the flexographic printing precursors FPP-01 to FPP-22 is shown in Table 3. The exposed areas to UV-A of the flexographic printing precursors did not show any removal of material. In the same table the Shore A hardness and flexibility is also included.

TABLE 3

| Flexographic printing precursor | | Magnetic development level | Hardness (Shore A) | Flexibility |
|---|---|---|---|---|
| FPP-01 | COMP | 0 | 68 | 1 |
| FPP-02 | COMP | 0 | 68 | 2 |
| FPP-03 | COMP | 0 | 62 | 3 |
| FPP-04 | COMP | 0 | 60 | 3 |
| FPP-05 | COMP | 0 | 64 | 1 |
| FPP-06 | COMP | 0 | 64 | 2 |
| FPP-07 | COMP | 0 | 54 | 3 |
| FPP-08 | COMP | 0 | 58 | 3 |
| FPP-9 | INV | 2 | 60 | 2 |
| FPP-10 | INV | 4 | 54 | 3 |
| FPP-11 | INV | 3 | 57 | 3 |
| FPP-12 | INV | 1 | 59 | 2 |
| FPP-13 | INV | 3 | 50 | 3 |
| FPP-14 | INV | 2 | 53 | 3 |
| FPP-15 | INV | 1 | 57 | 1 |
| FPP-16 | INV | 5 | 58 | 2 |
| FPP-17 | INV | 4 | 54 | 3 |
| FPP-18 | INV | 3 | 58 | 3 |
| FPP-19 | INV | 2 | 59 | 1 |
| FPP-20 | INV | 2 | 57 | 2 |
| FPP-21 | INV | 3 | 49 | 3 |
| FPP-22 | INV | 2 | 49 | 3 |

The results in Table 3 illustrate that flexographic printing precursors prepared from curable compositions containing magnetisable particles (INV) can be developed by means of a magnetic field. The flexographic printing plates without iron particles in the photopolymerisable layer (COMP) do not show magnetic development. The results also show that the higher the flexibility of the polymerisable layer is, the more complete the removal of material from the non-exposed areas is. The higher flexibility of the flexographic printing precursor is obtained by using elastomeric binders with low styrene monomer content (see FPP-10, 11, 17, 18, 21, 22).

Example 2

This example illustrates the magnetic development properties obtained with a liquid photopolymerisable composition comprising iron particles. This example also illustrates the benefit of an absorbent material in the development process.

Preparation of the Photopolymerisable Layer

A liquid photopolymerisable composition S-9 was prepared by mixing the ingredients of Table 4 at room temperature until complete dissolution.

TABLE 4

| Compound | (g) |
|---|---|
| SR339C | 26.3 |
| SR531 | 6.6 |
| Omnimer ACMO | 4.7 |
| SR9035 | 2.3 |
| SR351 | 2.3 |
| CD278 | 1.3 |
| Byk UV3510 | 0.2 |
| Irgacure 819 | 3 |
| Iron powder | 8.2 |

Image Wise Exposure

A silicon spacer (2.0 mm thickness) was stuck to a PET support to form a rectangular receptacle of 1×10 cm. The receptacle was filled with the liquid composition S-9. Excess liquid was removed by a clean cut metal blade. A flexographic printing precursor FPP-23 was hence obtained. The flexographic printing precursor was covered by a polyester/silicone release layer of 23 μm. One half of the rectangular sample was covered by a cardboard having an UV optical higher than 4.0. The back side of the package (side of the PET support) was exposed for 5 minutes to UV-A radiation using the source as described above to obtain a cured floor. Subsequently an UV-A exposure of the front side (the side with the mask) was performed for 10 minutes.

Magnetic Development

The cardboard and polyester/silicone release layer were removed after exposing the package. Magnetic development of the exposed flexographic printing precursor was performed by using the same magnetic drum clamp as in the previous example. Two ways of development were performed. One way with the magnet not covered by the absorbent material and one way with the magnet covered by a piece of absorbent paper. The absorbent paper assisted in the removal of uncured liquid in the non-exposed area. As the sample was placed horizontally, the absorbent covered magnet was contacted with the surface of the front side of the flexographic printing precursor and moved horizontally across the surface. This was repeated three times. The magnetic development level, as observed visually, has been given a rating number from 0 to 5 (0 meaning no removal of material from the areas not exposed to the front side UV-A exposure, 5 meaning full removal of material from the areas not exposed to the front side UV-A exposure). The results of the three development cycles with the magnet covered with absorbent are summarised in Table 5.

TABLE 5

| | Magnetic development level with absorbent |
|---|---|
| Exposed area to UV-A | 0 |
| Unexposed area, cycle 1 | 3 |
| Unexposed area, cycle 2 | 4 |
| Unexposed area, cycle 3 | 4 |

The results of Table 5 illustrate that flexographic printing precursors prepared from a liquid curable composition containing magnetic particles can be developed by means of a magnetic field. Magnetic development using a magnet without absorbent was characterised by the extraction of iron particles from the liquid composition in the non-exposed areas of the photopolymerisable layer and the rest of the material in the non-exposed area was not fully removed after 3 cycles. The use of an absorbent material improves transfer of uncured material during development and shows the advantage of easy removal of uncured material after development. It was also observed that separation occurred during development between the material in the non-exposed areas from the front side (which was removed) and the flexographic printing floor obtained by the UV-A exposure through the back of the flexographic printing precursor. The thickness of the floor was measured to be 1.4 mm using a calliper.

Example 3

This example illustrates the superior magnetic development properties obtained with a liquid photopolymerisable composition comprising iron particles. This example also illustrates that a higher amount of iron particles further improves the magnetic development.

Preparation of Photopolymerisable Composition

The photopolymerisable compositions S-10 to S-13 were prepared by mixing the ingredients from Table 6 at room temperature.

TABLE 6

| Compound | S-10 | S-11 | S-12 | S-13 |
| --- | --- | --- | --- | --- |
| Verbatim HR50 | 60.0 g | 60.0 g | 60.0 g | 60.0 g |
| BHT | 0.04 g | 0.04 g | 0.04 g | 0.04 g |
| Irgacure 127 | 3.0 g | 3.0 g | 3.0 g | 3.0 g |
| Iron powder | 0 | 5.55 g | 11.10 g | 63.04 g |

A silicon spacer (1 mm thickness) was stuck to a PET support to form a rectangular receptacle of 3×4 cm. The obtained reservoir was filled with the photopolymerisable compositions S-10 to S-13 from Table 6. Excess liquid was removed by a clean cut metal blade. Flexographic printing precursors FPP-24 to FPP-27 was hence obtained. The coated layer was covered by a polyester/silicone release layer of 23 µm. A strip of cardboard having a size of 1×5 cm and having an UV optical density higher than 4.0 was placed on top of the package in the middle of the sample. The back side (PET support side) of the package was exposed for 5 minutes to UV-A radiation as described above. The front side of the package was subsequently exposed to UV-A for 10 minutes with the same exposing device. The distance between the lamps and the sample was approximately 10 cm.

Magnetic Development

The card board and polyester/silicone protective layer were removed from the exposed flexographic printing precursors. Magnetic development of the cured flexographic printing precursors was performed using the same magnetic drum clamp as in previous examples. The magnet was covered by a piece of absorbent material to assist in removal of the uncured material. As the sample was placed horizontally, the tissue covered magnet was contacted with the composition surface and moved horizontally across the surface. The magnetic development level, as observed visually, has been given a rating number from 0 to 5 (0 meaning no removal of material from the non-exposed areas through the front side exposure, 5 meaning full removal of the material from the non-exposed areas through the front side exposure). The results are shown in Table 7.

TABLE 7

| Flexographic printing precursor | Photopolymerisable solution | | Magnetic development level | Hardness Shore A |
| --- | --- | --- | --- | --- |
| FPP-24 | S-10 | COMP | 0 | 48 |
| FPP-25 | S-11 | INV | 4 | 48 |
| FPP-26 | S-12 | INV | 5 | 49 |
| FPP-27 | S-13 | INV | 5 | 44 |

The flexibility of all samples was excellent. Table 7 illustrates that with the inventive samples FPP-25, FPP-26, FPP-27 a superior magnetic development is obtained compared to the comparative sample FPP-24. Material with a layer thickness of 1.0 mm was removed in only one magnetic development step.

The invention claimed is:

1. A method of making a flexographic printing element, the method comprising the steps of:
    a) providing a flexographic printing precursor including:
        a support; and
        a photopolymerizable layer including a monomer, an initiator, and magnetic or magnetizable particles, the photopolymerizable layer having a thickness between 0.5 mm and 7.0 mm;
    b) image wise exposing the flexographic printing precursor to obtain exposed and non-exposed areas in the photopolymerizable layer; and
    c) bringing the photopolymerizable layer into a magnetic field having a magnitude and direction to at least partially remove the photopolymerizable layer in the non-exposed areas of the photopolymerizable layer.

2. The method of making a flexographic printing element according to claim 1, wherein
    during step c), contacting the photopolymerizable layer with an absorbent material.

3. The method of making a flexographic printing element according to claim 2, further comprising the step of:
    applying heat to the photopolymerizable layer until the non-exposed areas are in a melted state.

4. The method of making a flexographic printing element according to claim 1, wherein the step of image wise exposing includes exposing the flexographic printing precursor to actinic radiation through a mask.

5. The method of making a flexographic printing element according to claim 2, wherein the step of image wise exposing includes exposing the flexographic printing precursor to actinic radiation through a mask.

6. The method of making a flexographic printing element according to claim 5, wherein the mask includes a laser ablatable layer.

* * * * *